(12) United States Patent
Liao

(10) Patent No.: US 7,230,303 B1
(45) Date of Patent: Jun. 12, 2007

(54) SEMICONDUCTOR MEMORY DEVICE WITH REDUCED SOFT ERROR RATE (SER) AND METHOD FOR FABRICATING SAME

(75) Inventor: I Chi Liao, Pingchin (TW)

(73) Assignee: GSI Technology, Inc., Santa Clara, CA (US)

( * ) Notice: Subject to any disclaimer, the term of this patent is extended or adjusted under 35 U.S.C. 154(b) by 53 days.

(21) Appl. No.: 10/967,027

(22) Filed: Oct. 15, 2004

(51) Int. Cl.
*H01L 29/76* (2006.01)
*H01L 29/94* (2006.01)
*H01L 31/00* (2006.01)
*H01L 27/01* (2006.01)
*H01L 27/12* (2006.01)

(52) U.S. Cl. .................... 257/369; 257/350; 257/351; 257/357; 257/371; 438/514; 438/527; 438/532

(58) Field of Classification Search ............... 438/514, 438/527, 532; 257/350–351, 357, 369, 371
See application file for complete search history.

(56) References Cited

U.S. PATENT DOCUMENTS

| | | | |
|---|---|---|---|
| 6,271,105 B1 | 8/2001 | Kwon et al. | |
| 6,455,363 B1 | 9/2002 | Puchner et al. | |
| 6,472,715 B1 | 10/2002 | Liu et al. | |
| 6,756,616 B2 * | 6/2004 | Rhodes | 257/291 |
| 6,838,329 B2 * | 1/2005 | Weber et al. | 438/217 |
| 2001/0016389 A1 * | 8/2001 | Wang et al. | 438/276 |
| 2003/0136982 A1 * | 7/2003 | Rhodes | 257/232 |
| 2003/0173591 A1 * | 9/2003 | Cable et al. | 257/200 |
| 2004/0192055 A1 * | 9/2004 | Weber et al. | 438/705 |

OTHER PUBLICATIONS

Larry D. Edmonds, "Electric Currents Through Ion Tracks in Silicon Devices", IEEE Transactions on Nuclear Science, Dec. 1998, vol. 45, No. 6, pp. 3153-3164.
R. M. Warner, Jr. and B. L. Grung, "Transistors: Fundamentals for the Integrated—Circuit Engineer", 1983, p. 195.

* cited by examiner

*Primary Examiner*—Ida M. Soward
(74) *Attorney, Agent, or Firm*—DLA Piper US LLP

(57) ABSTRACT

The present invention provides a semiconductor memory device with reduced soft error rate (SER) and a method for fabricating such a device. The semiconductor memory device includes a plurality of implants of impurity ions that provide for a reduced number of minority carriers having less mobility. A fabrication process for the semiconductor memory includes a "non-retrograde" implant of impurity ions that is effective to suppress the mobility and lifetime of minority carriers in the devices, and a "retrograde" implant of impurity ions that is effective to substantially increase the doping concentration at the well bottom to slow down or eliminate additional minority carriers.

7 Claims, 7 Drawing Sheets

SEMICONDUCTOR MEMORY DEVICE WITH REDUCED SOFT ERROR RATE (SER) AND METHOD FOR FABRICATING SAME

FIELD OF THE INVENTION

The present invention generally relates to semiconductor memory devices and more particularly, to a semiconductor memory device with reduced soft error rate (SER) and a method for fabricating the device.

BACKGROUND OF THE INVENTION

Soft error rate (SER) measures how often, when a memory device is accessed, incorrect data is provided due to external radiation, such as alpha particles or cosmic rays, which can penetrate and upset the operation of the memory device. SER is becoming a more stringent problem as device geometries continue to be reduced, making the devices more susceptible to such phenomena. This issue is even worse for SRAM devices since the storage node capacitance is much smaller for SRAM devices as compared with DRAM devices, which have a relatively large storage capacitor in each bit. Due to their fast operation, SRAM devices still prevail in many high speed applications such as networking, communications, and the like.

Several ways have been proposed to deal with SER issues. Generally, these can be categorized into two groups: (i) adding a capacitor to the storage node to enlarge the critical charge (Qcrit) of the device and make it harder to flip the state of the device; and (ii) reducing the storage node's collecting efficiency of minority carriers, so that flipping the state of the device becomes more difficult. While some of these prior art strategies are successful in reducing the SER numbers, they typically require extra masks and process steps that can reduce overall yield. This makes these strategies expensive to implement. Additionally, some of these strategies are of limited effect in reducing the SER numbers, and are inadequate for advanced technologies.

For these reasons, it would be desirable to provide a new and improved semiconductor memory device having reduced susceptibility to SER and a method for fabricating such a device.

SUMMARY OF THE INVENTION

Generally, the present invention provides a semiconductor memory device with reduced soft error rate (SER) and a method for fabricating such a device. The semiconductor memory device includes a plurality of implants of impurity ions that provide for a reduced number of minority carriers with less mobility. A fabrication process for the semiconductor memory includes performing a "non-retrograde" implant of impurity ions that is effective to suppress the mobility and lifetime of minority carriers in the devices, and performing a "retrograde" implant of impurity ions that is effective to substantially increase the doping concentration at the well bottom to slow down or eliminate additional minority carriers.

One non-limiting advantage of the invention is that it provides a fabrication process that suppresses SER in memory devices without requiring extra masks in the fabrication process.

Another non-limiting advantage of the invention is that it provides a simple and inexpensive fabrication process that reduces SER in semiconductor memory devices with no negative effects on yield concerns.

Another non-limiting advantage of the invention is that it produces semiconductor memory devices having a prominent reduction in SER without a speed penalty.

Another non-limiting advantage of the invention is that it is not limited by the photolithography process, and thus is very easily adapted for advanced technologies and can be easily used together with other procedures to get multiplying effects.

According to a first aspect of the present invention, a semiconductor memory device structure is provided. The structure includes a well including a cell region; a non-retrograde implant of impurity ions in the well, adapted to suppress mobility and lifetime of minority carriers in the well; and a retrograde implant of impurity ions in the well, adapted to substantially reduce minority carriers in a bottom region of the well.

According to a second aspect of the present invention, a method for fabricating a semiconductor memory device is provided. The method includes forming a well in a substrate; forming a cell region in the well; performing a non-retrograde implant of impurity ions in the well, adapted to suppress mobility and lifetime of minority carriers in the well; and performing a retrograde implant of impurity ions in the well, adapted to substantially reduce minority carriers in a bottom region of the well.

According to a third aspect of the present invention, a method is provided for reducing SER susceptibility in a semiconductor memory device including a substrate having a well and a cell region disposed in the well. The method includes performing a non-retrograde implant of impurity ions in the well, adapted to suppress mobility and lifetime of minority carriers in the well; and performing a retrograde implant of impurity ions in the well, adapted to substantially reduce minority carriers in a bottom region of the well.

These and other features, advantages, and objects of the invention will become apparent by reference to the following specification and by reference to the following drawings.

DETAILED DESCRIPTION OF THE EMBODIMENTS

The present invention will now be described in detail with reference to the drawings, which are provided as illustrative examples of the invention so as to enable those skilled in the art to practice the invention. The preferred embodiment of the invention is described in relation to a volatile SRAM device and the associated fabrication procedure. However, it will be appreciated by those skilled in the art that the present invention is equally applicable to other types of memory devices affected by soft error rate (SER) and related fabrication procedures.

Figure 1A:
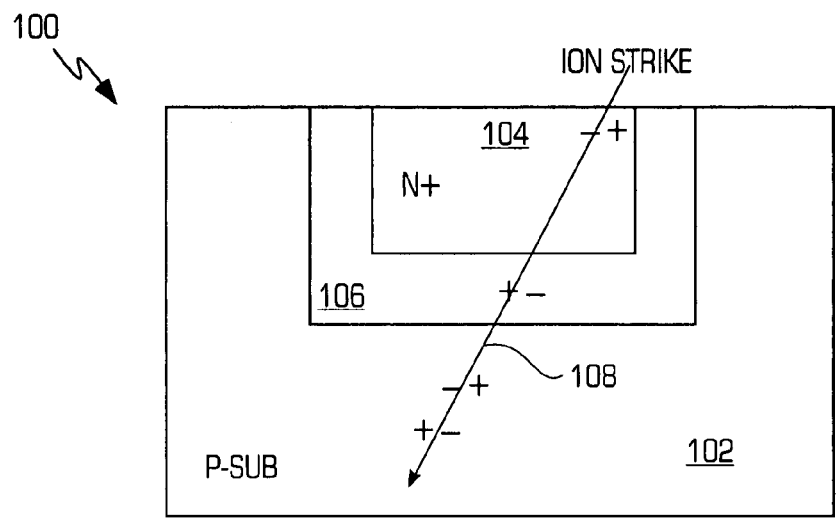
FIGS. 1A–1D depict the occurrence of a soft error failure in a semiconductor memory device made in accordance with the prior art.

FIGS. 1A–1D illustrate the soft error failure mechanism in a semiconductor memory device of the prior art. FIG. 1A depicts a side sectional view of an N+/P− junction that forms a portion of a semiconductor memory device 100, according to the prior art. The portion of the device 100 shown includes a P− substrate 102, an N+ node 104, and a depletion region 106 that is formed between the P− substrate 102 and N+ node 104. In this example, the N+/P− junction has a reverse bias voltage of Vr, e.g., N+ is at Vr and P− is at ground. In FIG. 1A, the device 100 is hit by an energetic particle, which generates high level electron-hole pairs along the track 108.

Figure 1B:
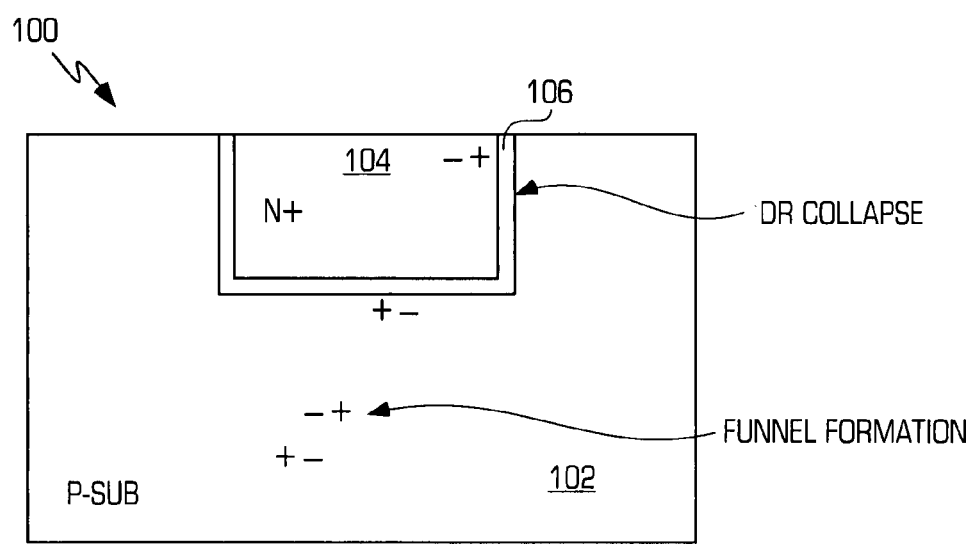
Figure 1C:
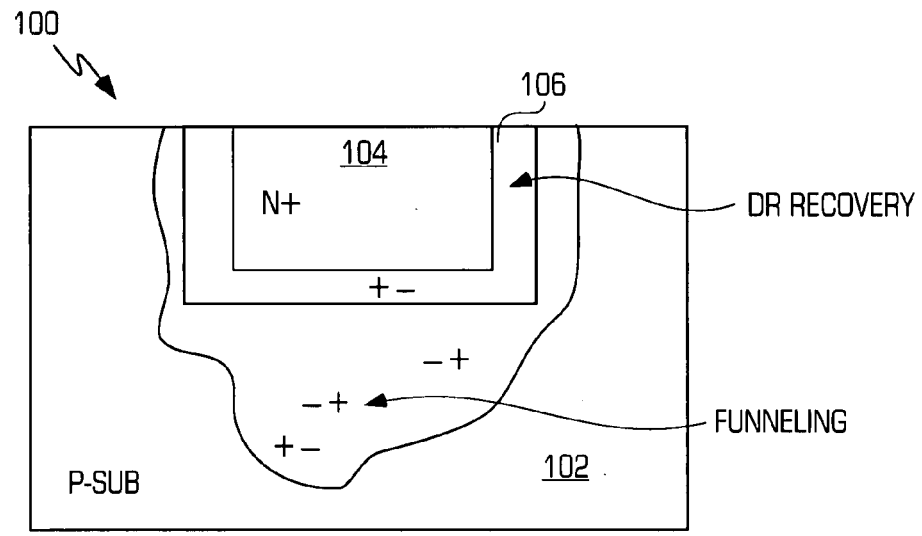
Figure 1D:
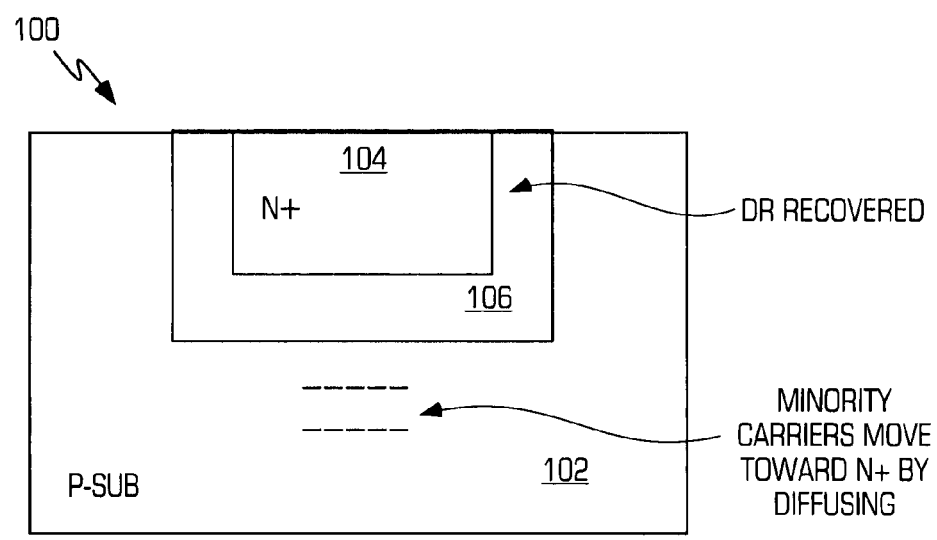

FIG. 1B depicts a second step in the soft error failure process. In this step, the depletion region (DR) 106 collapses due to the relatively high level injection, and a funnel begins to form. In FIG. 1C, the funnel 110 has formed and the depletion region 106 is in recovery at the same time. Minority carriers (electrons in this case) drift toward N+ node 104. In FIG. 1D, the depletion region 106 has recovered and the funnel has disappeared. The residual minority carriers in the substrate move toward N+ node 104 by diffusing. When enough charge accumulates on the N+ node 104, it can cause incorrect readings of the memory cell, thereby resulting in a soft error.

The current in the substrate during this soft error process may be represented by the following equation:

$$J = \sigma * [((B*Vt)/(P+A))*\nabla P - \nabla \phi]$$

where P represents excess carrier density, $\nabla \phi$ represents a gradient of electrostatic potential (drift term), $\nabla P$ represents a gradient of minority carriers (diffusion term), Vt is the thermal voltage (about 0.026 v at room temp), A is $\mu h/(\mu e + \mu h)$ for p-type, and $\mu e/(\mu e + \mu h)$ for n-type, B is $(\mu e - \mu h)/(\mu e + \mu h)$, and $\sigma$ is $q[\mu h(P+p0) + \mu e(N+n0)]$ (conductivity).

With respect to terms A, B and $\sigma$, $\mu e$ and $\mu h$ are the electron and hole mobility, respectively, and n0 and p0 are the equilibrium electron and hole densities, respectively.

From the equations above, it is evident that if mobility ($\mu$) is lower, the conductivity ($\sigma$) will be lower, thus providing a lower current (J). In an N+/P− junction, electrons will drift toward storage node according to the electric field and the gradient of carrier concentration. Thus, by lowering the mobility, we can reduce the current J (here as minority carriers current), and suppress SER.

Another method to suppress SER would be to minimize the collection of minority carriers. One of the ways to accomplish this would be to reduce the minority carrier lifetime, causing less minority carriers to be collected by the storage node (reducing "P" in the equation). It is known that minority carrier lifetime declines as substrate doping increases (e.g., lifetime declines according to $N^{-1.34}$). This is due to slower mobility caused by coulomb interaction between minority carriers and impurity ions. And thus electrons more easily recombine with holes.

The present invention implements these concepts to provide a semiconductor memory device, such as an SRAM device, with suppressed SER. In one embodiment, this is achieved by use of two separate ion implants, a "non-retrograde" implant of impurity ions that is effective to suppress the mobility and lifetime of minority carriers in the devices, and a "retrograde" implant of impurity ions that is effective to substantially increase the doping concentration at the well bottom to slow down or eliminate additional minority carriers. As used herein, the term "retrograde" implant is intended to mean an implant where the highest concentration of dopant is located relatively deep beneath the surface; and the term "non-retrograde" implant is intended to mean an implant where the highest concentration of dopant is not located relatively deep beneath the surface.

Figure 2A:
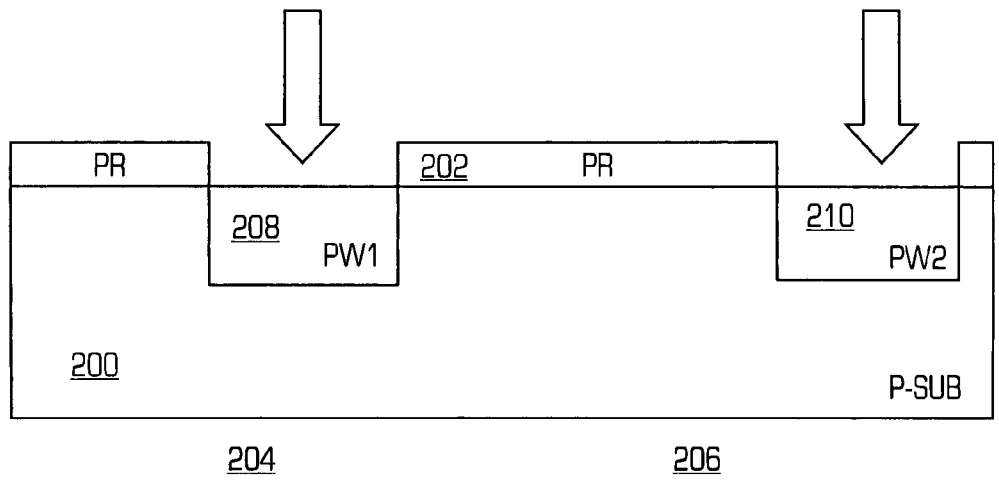
FIGS. 2A–2H depict an exemplary process flow for fabricating a semiconductor memory device with reduced SER, according to the present invention.

FIGS. 2A–2H depict an exemplary embodiment of a process flow, which may be utilized for fabricating a semiconductor memory device with reduced SER, according to the present invention. FIG. 2A depicts a side sectional view of a conventional substrate 200, which may comprise a conventional semiconductor material. In the first step of the process flow, a mask photoresist material 202 is applied to the substrate 200 to define several P well regions 208, 210 (PW1, PW2). The device shown will include an SER sensitive area or side 204, which will be designed to have reduced SER, and a speed sensitive area or side 206, which will be formed in a convention manner. In this step, the P wells 208, 210 are formed in conventional manner by implanting P type dopant in substrate 200. In one embodiment, the P wells are non-retrograde wells.

Figure 2B:
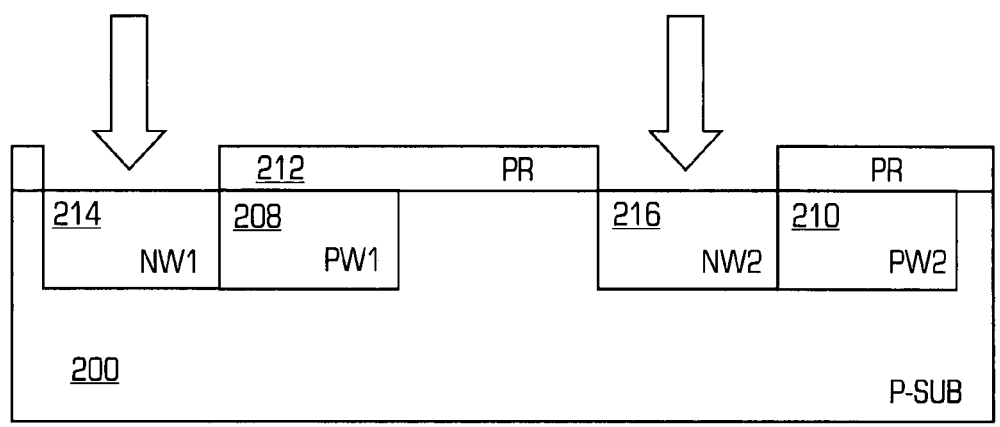

FIG. 2B illustrates a second step in the process flow. In this second step, a second mask of photoresist material 212 is applied to the substrate 200 to define several N wells 214, 216 (NW1, NW2), which are adjacent to P wells 208, 210, respectively. In this step, the N wells 214, 216 are formed in conventional manner by implanting N type dopant into substrate 200. In one embodiment, the N wells are non-retrograde wells.

Figure 2C:
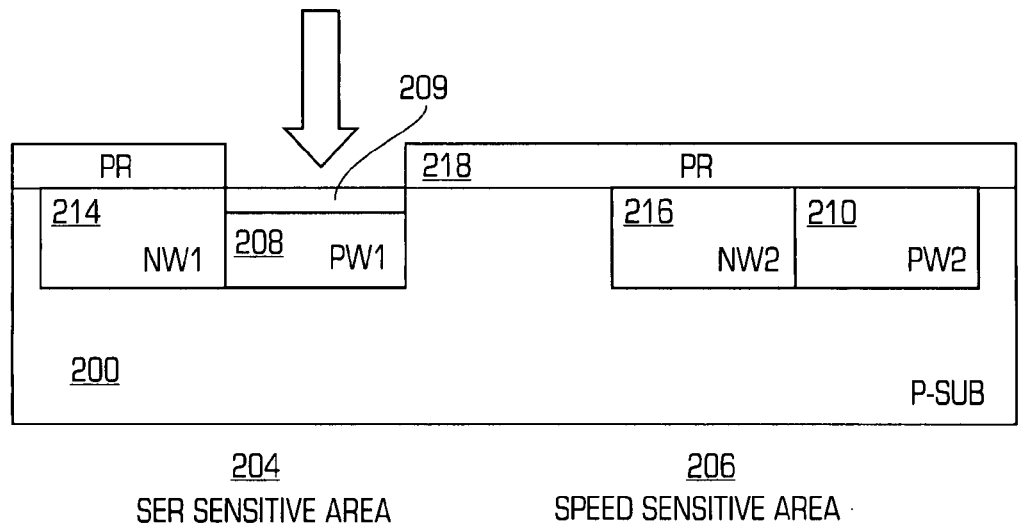

In the next step of the process flow, illustrated in FIG. 2C, a third mask of photoresist material 218 is applied to the substrate 200, and one or more N cells 209 are formed in P well 210. The N cells may be formed in a conventional manner by implanting a P type dopant in P well 208.

Figure 2D:
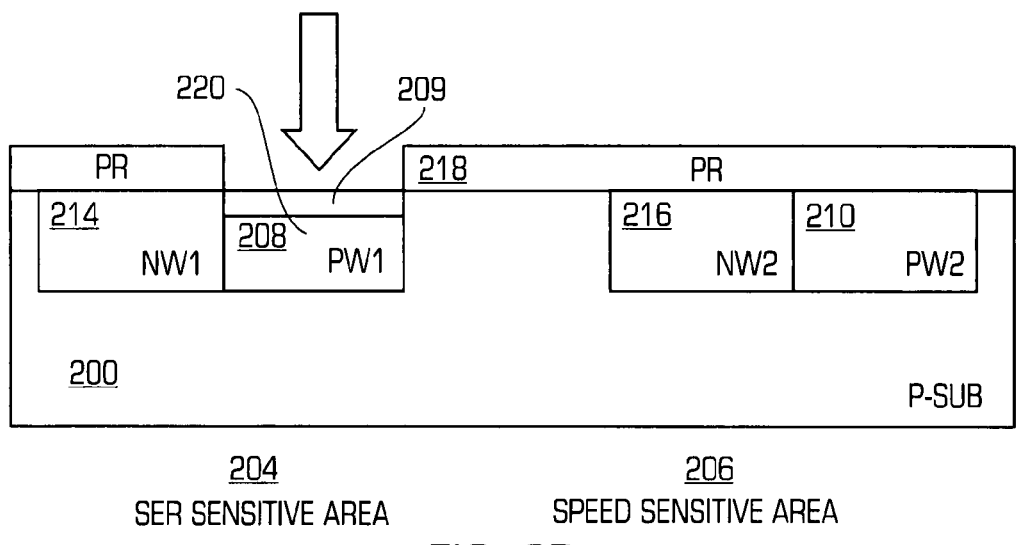

In the next step of the process flow, illustrated in FIG. 2D, a first SER reduction implant is performed in order to suppress the mobility and lifetime of minority carriers in the device. This SER reduction implant increases the doping concentration from the subsurface of P well 208 in region 220. Particularly, this step may include a non-retrograde implant from the subsurface of P well 208. In one embodiment, the implant material is Boron-11 (B11), the implant energy is between about 50 kev and about 180 kev, the dose is between about $1e^{13}$ to about $2e^{13}$ ions/cm$^2$, the depth is from about 0.2 μm to about 1 μm below the surface, and the concentration is from about $6e^{17}$ to about $5e^{18}$ ions/cm$^3$. In one specific example, about $1.8e^{14}$ ions/cm$^2$ of B11 ions implanted at an energy of about 70 kev was effective to suppress the mobility and lifetime of minority carriers.

Figure 2E:
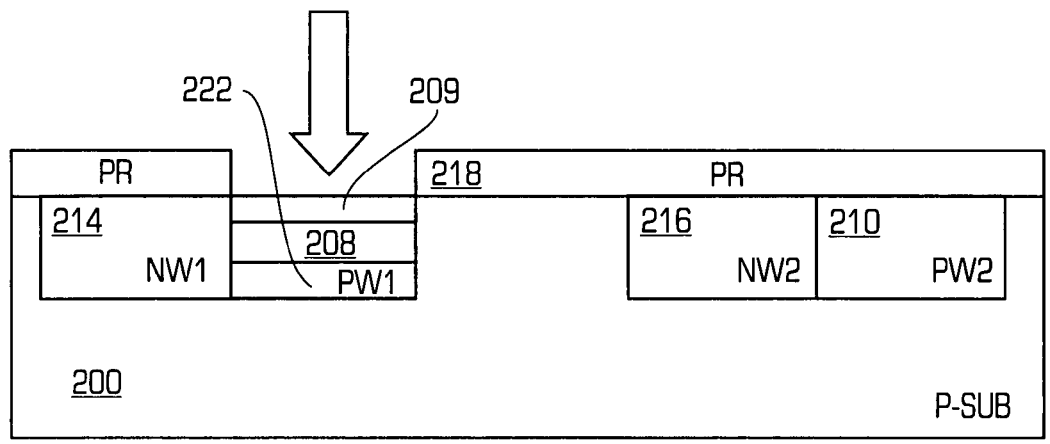

In the next step of the process flow, illustrated in FIG. 2E, a second SER reduction implant is performed on this portion of the device in order to substantially increase the doping concentration at the well bottom to slow down or eliminate additional minority carriers. This SER reduction implant increases the doping concentration at the bottom of P well 208 in region 222. Particularly, this step may include a retrograde implant to the bottom region 222 of P well 208. In one embodiment, the implant material is Indium (In), the implant energy is between about 1.5 Mev and about 2 Mev, the dose is between about $1e^{13}$ to about $2e^{14}$ ions/cm$^2$, the depth is from about 0.5 μm to about 1 μm below the surface, and the concentration is from about $1e^{17}$ to about $1e^{18}$ ions/cm$^3$. In one specific example, about $4e^{13}$ ions/cm$^2$ of In ions implanted at an energy of about 1.7 Mev was effective to slow down or eliminate additional minority carriers.

Figure 2F:
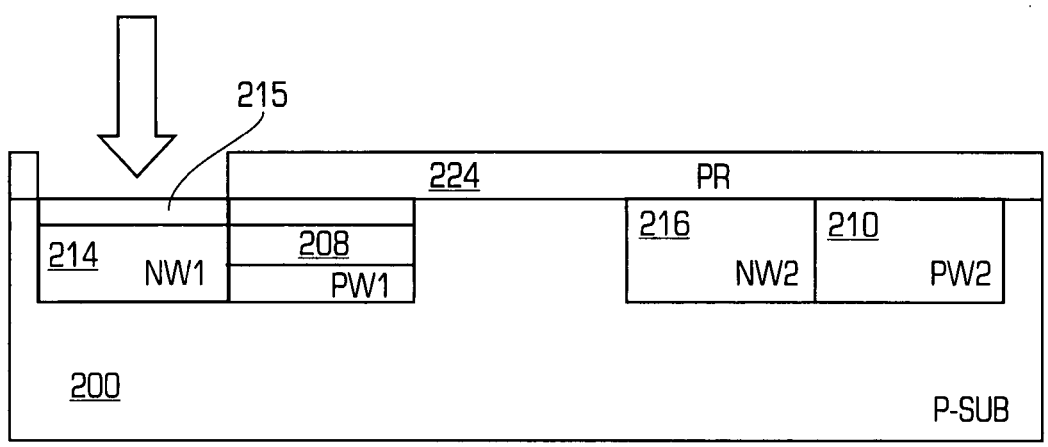

In the next step of the process flow, illustrated in FIG. 2F, a fourth mask of photoresist material 224 is applied to substrate 200, and one or more P cells 215 are formed in N well 214. The P cells may be formed in a conventional manner by implanting a N type dopant in N well 214.

Figure 2G:
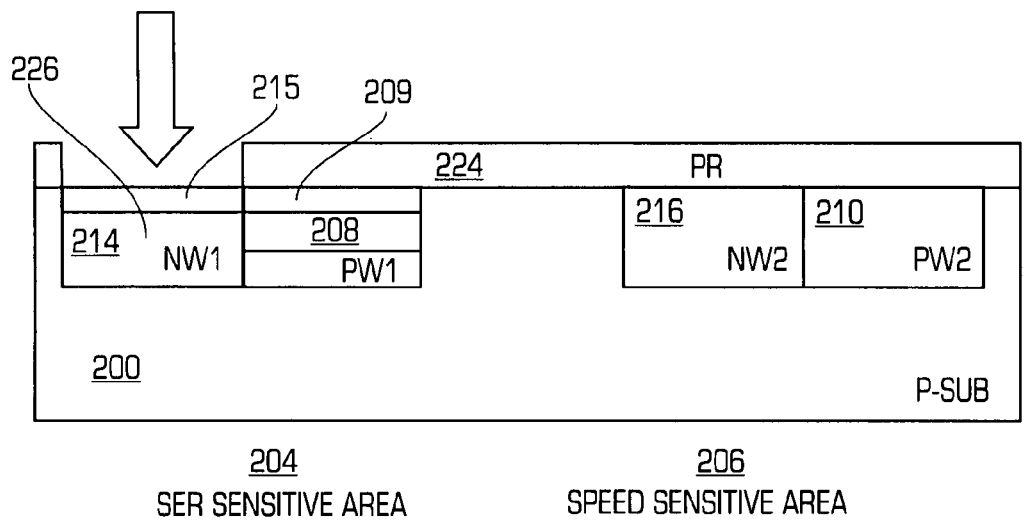

In the next step of the process flow, illustrated in FIG. 2G, a first SER reduction implant is performed in order to suppress the mobility and lifetime of minority carriers in this portion of the device. This SER reduction implant increases the doping concentration from the subsurface of N well 214 in region 226. Particularly, this step may include a non-retrograde implant from the subsurface of N well 214. In one embodiment, the implant material is Phosphorous-31 (P31), the implant energy is between about 150 kev and about 400 kev, the dose is between about $1e^{13}$ to about $2e^{13}$ ions/cm², the depth is from about 0.2 μm to about 1 μm below the surface, and the concentration is from about $6e^{17}$ to about $5e^{18}$ ions/cm³. In one specific example, about $4e^{13}$ ions/cm² of P31 ions implanted at an energy of about 240 kev was effective to suppress the mobility and lifetime of minority carriers.

Figure 2H:
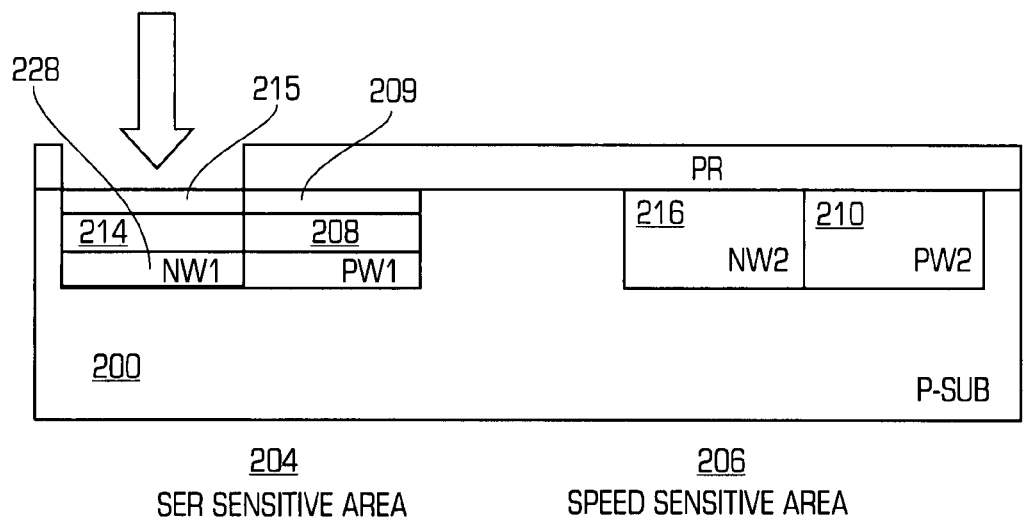

In the next step of the process flow, illustrated in FIG. 2H, a second SER reduction implant is performed on this portion of the device in order to substantially increase the doping concentration at the well bottom to slow down or eliminate additional minority carriers. This SER reduction implant increases the doping concentration at the bottom of N well 214 in region 228. Particularly, this step may include a retrograde implant to the bottom region 228 of N well 214. In one embodiment, the implant material is Arsenic (As), the implant energy is between about 1.5 Mev and about 2 Mev, the dose is between about $1e^{13}$ to about $1e^{14}$ ions/cm², the depth is from about 0.5 μm to about 1 μm below the surface, and the concentration is from about $1e^{17}$ to about $1e^{18}$ ions/cm³. In one specific example, about $4e^{13}$ of In ions implanted at an energy of about 1.2 Mev was effective to slow down or eliminate additional minority carriers.

Figure 3:
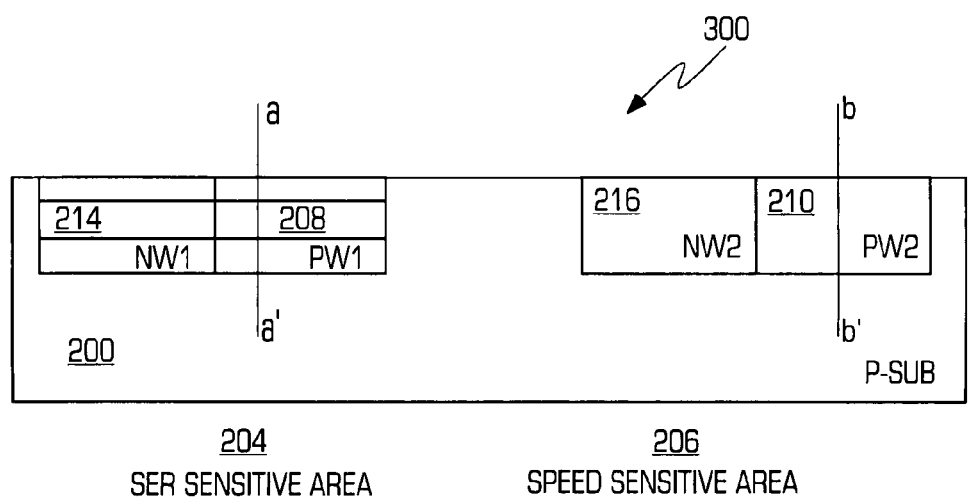
FIG. 3 is a cross-sectional view of a semiconductor memory device structure, according to the present invention.
Figure 4:
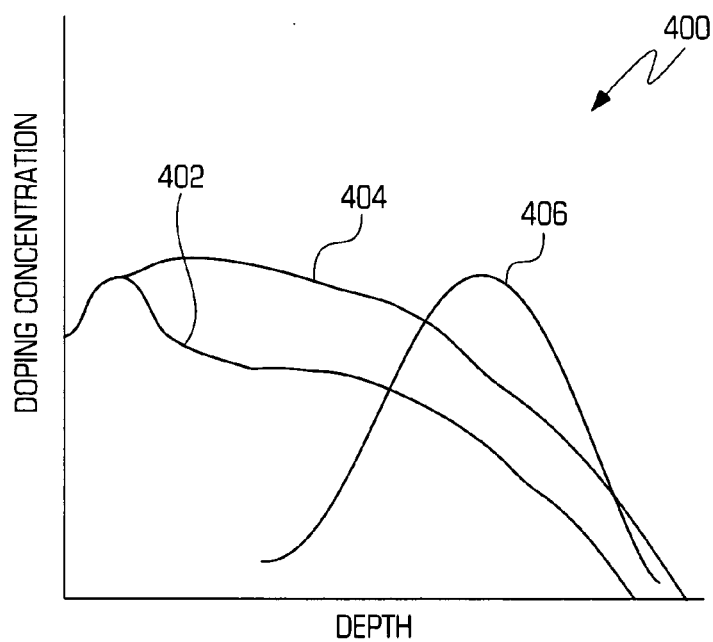
FIG. 4 is a graph illustrating doping profiles for an SER suppressed portion of the structure shown in FIG. 3 compared to a non-SER suppressed portion of the structure.

FIG. 3 illustrates an example of the resulting semiconductor device structure 300 having suppressed SER. The semiconductor memory device may be completed by processing structure 300 in a conventional manner. The resulting device will have suppressed SER in the SER sensitive area 204 of the device. Particularly, the specific doping profiles of the various implants will reduce the chance of SER errors by suppressing the mobility and lifetime of minority carriers, and by slowing down and eliminating minority carriers at the bottom portion of the respective wells. One example of these profiles is depicted in FIG. 4, which illustrates a graph 400 showing doping concentration versus depth for an SER suppressed well 208 compared to a conventional well 210. In FIG. 4, curve 402 represents the doping concentration versus depth for the conventional well 210, taken along line b–b' shown in FIG. 3; curve 404 represents the doping concentration of the non-retrograde implant versus depth for the SER suppressed well 208, taken along line a–a' shown in FIG. 3; and curve 406 represents the doping concentration of the retrograde implant versus depth for the SER suppressed well 208, taken along line a–a' shown in FIG. 3. As will be appreciated to those skilled in the art, the non-retrograde implant 404 will be effective to suppress the mobility and lifetime of minority carriers in the device, and the retrograde implant 406 will be effective to substantially increase the doping concentration at the well bottom to slow down and/or eliminate additional minority carriers.

Accordingly, the present invention provides a semiconductor memory device, such as an SRAM device, with reduced SER. The fabrication process used to manufacture the device is simple and inexpensive and provides a prominent reduction in SER without requiring extra masks in the fabrication process. Because the fabrication technique is not limited by the photolithography process, it is thus very easily adapted for advanced technologies and can be easily used together with other procedures to get multiplying effects.

It should be understood that the inventions described herein are provided by way of example only and that numerous changes, alterations, modifications, and substitutions may be made without departing from the spirit and scope of the inventions as delineated within the following claims.

What is claimed is:

1. A semiconductor memory device structure comprising:
   a P well including a cell region;
   a non-retrograde implant of impurity ions in the well, adapted to suppress mobility and lifetime or minority carriers in the well, wherein the non-retrograde implant comprises Boron-11; and
   a retrograde implant of impurity ions in the well, adapted to substantially reduce minority carriers in a bottom region of the well.

2. The semiconductor memory device structure of claim 1 wherein the non-retrograde implant is achieved using an implant energy of between about 50 kev and about 180 kev, a dose of about $1e^{13}$ to about $2e^{13}$ ions/cm² and a concentration of about $6e^{17}$ to about $5e^{18}$ ions/cm³.

3. A semiconductor memory device structure comprising:
   a P well including a cell region;
   a non-retrograde implant of impurity ions in the well, adapted to suppress mobility and lifetime or minority carriers in the well; and
   a retrograde implant of impurity ions in the well, adapted to substantially reduce minority carriers in a bottom region of the well, wherein the retrograde implant comprises Indium.

4. The semiconductor memory device structure of claim 3 wherein the retrograde implant is achieved using an implant energy between about 1.5 Mev and about 2 Mev, a dose of about $1e^{13}$ to about $2e^{14}$ ions/cm², and a concentration of about $1e^{17}$ to about $1e^{18}$ ions/cm³.

5. A semiconductor memory device structure comprising:
   an N well including a cell region;
   a non-retrograde implant of impurity ions in the well, adapted to suppress mobility and lifetime or minority carriers in the well, wherein the non-retrograde implant comprises Phosphorous-31; and
   a retrograde implant of impurity ions in the well, adapted to substantially reduce minority carriers in a bottom region of the well.

6. The semiconductor memory device structure of claim 5 wherein the non-retrograde implant is achieved using an implant energy of between about 150 kev and about 400 kev, a dose of about $1e^{13}$ to about $2e^{14}$ ions/cm² and a concentration of about $6e^{17}$ to about $5e^{18}$ ions/cm³.

7. A semiconductor memory device structure comprising:
   an N well including a cell region;
   a non-retrograde implant of impurity ions in the well, adapted to suppress mobility and lifetime or minority carriers in the well; and
   a retrograde implant of impurity ions in the well, adapted to substantially reduce minority carriers in a bottom region of the well, wherein the retrograde implant comprises Arsenic;
   wherein the retrograde implant is achieved using an implant energy between about 1 Mev and about 1.5 Mev, a dose of about $1e^{13}$ to about $1e^{14}$ ions/cm², and a concentration of about $1e^{17}$ to about $1e^{18}$ ions/cm³.

* * * * *